United States Patent [19]

Bank et al.

[11] 4,344,028

[45] Aug. 10, 1982

[54] TESTING DEVICE FOR LOW-FREQUENCY AMPLIFIERS

[76] Inventors: Mikhail U. Bank, ulitsa Sofiiskaya, 40, korpus 1, kv. 128, Leningrad; Valery I. Prozorov, ulitsa Sovetskaya, 94, kv. 21, Sarapul; Nikolai A. Rubichev, pochtovoe otdelenie Mendeleeva, ulitsa Pionerskaya, 2, kv. 50, Moskovskaya oblast, all of U.S.S.R.

[21] Appl. No.: 200,599

[22] Filed: Oct. 24, 1980

[30] Foreign Application Priority Data

Oct. 24, 1979 [SU] U.S.S.R. .............................. 2824000

[51] Int. Cl.³ ............................................. G01R 27/00
[52] U.S. Cl. .................................. 324/57 N; 328/162; 330/2
[58] Field of Search ............. 324/57 N, 57 DE, 57 R; 330/2; 328/162

[56] References Cited

U.S. PATENT DOCUMENTS 3,978,401  8/1976  Lum .................................. 324/57 N

FOREIGN PATENT DOCUMENTS 473127  8/1975  U.S.S.R. .

OTHER PUBLICATIONS

"Real-Time ⅓ Octave Analyzer Type", Bruel & Kjaer, 1976.

*Primary Examiner*—Stanley T. Krawczewicz
*Attorney, Agent, or Firm*—Lilling & Greenspan

[57] ABSTRACT

Disclosed is a testing device for low-frequency amplifiers, comprising two sets of circuits connected to the output of the amplifier being tested. The first set of circuits is intended for measuring linear distortion, and the second set of circuits being designed for measuring non-linear distortion and interference. Each of the circuits forming the first set of circuits comprises a filter, a rectifier, a comparison means, and a squaring means which are connected in series. Each of the circuits forming the second set of circuits includes a filter, a rectifier, and a squaring means which are connected in series. The filters of the circuits of the first set of circuits are tuned to the frequency components of the test signal generated by sine wave voltage oscillators; and the filters of the circuits of the second set are tuned to frequencies differing from the frequency components of the test signal. The squaring means outputs are connected to the respective inputs of an indicating unit. Adders are being inserted between the outputs of the squaring means of the circuits whose filters are tuned to the frequency components of the output signal characterizing one and the same parameter of the low-frequency amplifier, and the respective inputs of the indicating unit.

2 Claims, 1 Drawing Figure

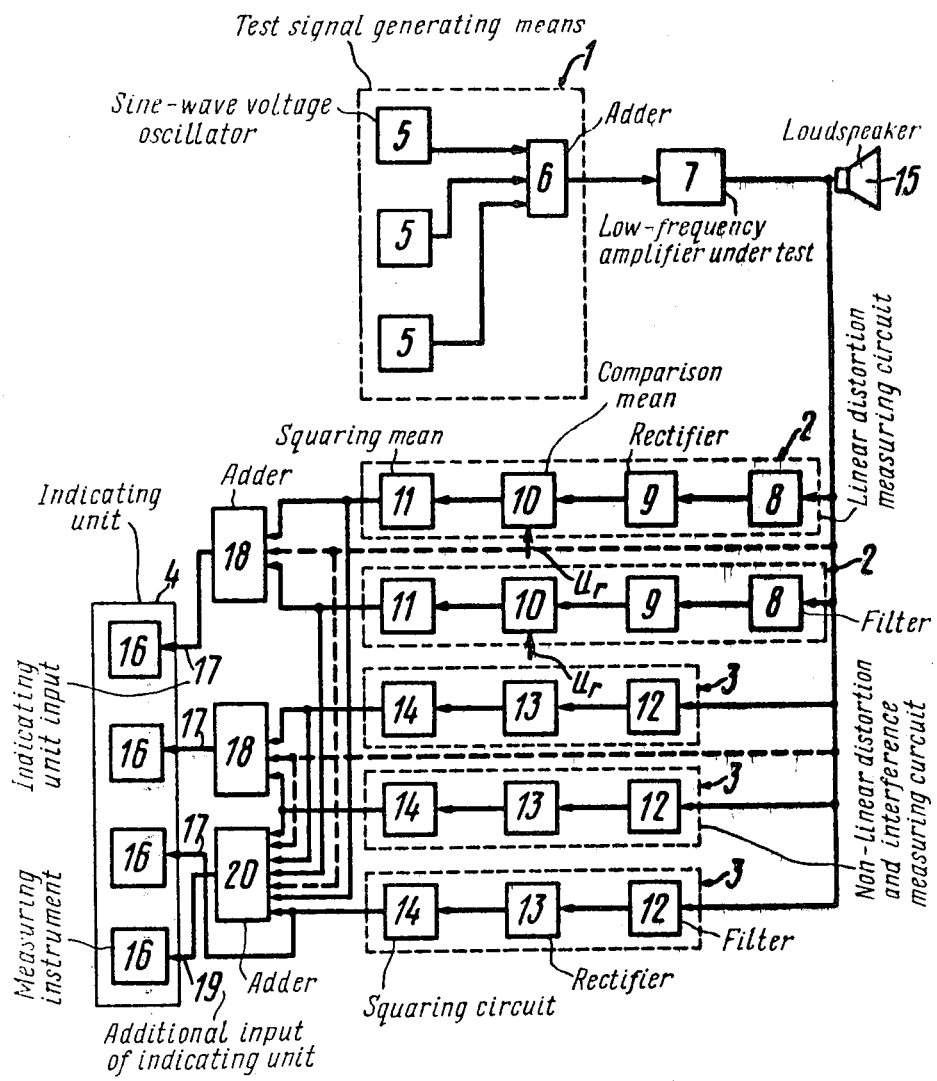

TESTING DEVICE FOR LOW-FREQUENCY AMPLIFIERS

FIELD OF THE INVENTION

The present invention relates to metering equipment for electronic apparatus and, more particularly, to testing devices for low-frequency amplifiers and can be used for both self-contained low-frequency amplifiers and low-frequency amplifiers forming part of television receivers, radio receivers, and magnetic tape recorders. Most advantageously, the invention can be used for check testing of low-frequency amplifiers in mass production.

DESCRIPTION OF THE PRIOR ART

Generally, the choice of an appropriate method and means for testing low-frequency amplifiers in mass production is based on a tradeoff between the tendency to reduce the testing time and the desire to make the testing more unbiased and complete. At present the testing process for low-frequency amplifiers consists of sequential steps of measuring linear distortion and non-linear distortion including interference, in particular, noise and background noise. Various types of non-linear distortion are measured by systems similar in their structure and comprising sine-wave signal oscillators and filters which separate spurious components that are not present in the input signal of the amplifier under test. (cf. Valitov R. A. et al. "Measurements in Electronics", Moscow, Publishing House "Sovetskoe radio", 1970, p. 398).

The most time-consuming operation is that of measuring linear distortion, that is most often implemented by means of a device incorporating a variable-frequency oscillator connected to the input of the low-frequency amplifier to be tested and an instrument for measuring voltage, connected to the output of the amplifier to be tested. This widely known device is used to carry out a number of sequential measurements at several frequencies followed by calculations on the measurement results. Thus, the use of the device described hereinabove results in a longer time required for linear distrition measurements, and consequently for checking the low-frequency amplifier parameters.

The reduction in the linear distortion measurement time can be attained by applying simultaneously several voltages to the amplifier under test. Known in the prior art is a device referred to as "real-time ⅓ octave analyzer" and developed by Bruel & Kjaer, that comprises a sine-wave signal oscillator, detectors whose number is equal to the number of oscillator frequencies, a gate means and a cathode-ray tube. Several voltages at respective frequencies are applied simultaneously to the amplifier under test, a line spectrum is displayed on the cathode-ray tube indicator and compared with the co-ordinate grid.

The device described hereinabove is rather complex and cannot be used under mass production conditions since the data obtained from the indicator require further processing.

Also known in the prior art is a testing device for low-frequency amplifiers (cf. USSR Inventor's Certificate No. 473127 patented in 1975), that comprises a test signal generating means connected to the input of the amplifier under test, a set of parallel circuits connected to the output of the amplifier under test and including a series combination of narrow-band filters, rectifiers, dispersion meters and comparison means, and an indicating unit comprising line indicators forming a visual display. A noise source is used as the test signal generating means. The above-mentioned device operates in the following manner. The noise source signal is applied to the low frequency amplifier under test, the output signal of the amplifier being distorted in accordance with the amplitude-frequency response characteristic thereof. The components of this signal separated by the filters are rectified and applied to the dispersion meters and to the comparison means where a signal proportional to the dispersion of the separated components is compared with a reference voltage and difference voltages are produced. Signals proportional to the difference voltages for each band are fed to the line indicators.

A disadvantage of the device under consideration is the incomplete coverage of the desired parameters by the tests since this device is not suitable for non-linear distortion measurements because of the continuous spectrum of the noise source. Furthermore considering the linear distortion measurement alone, it should be emphasized that in mass production, the measurement result must be represented by one or two values, while, in the device described hereinabove, the line indicators produce the measurement results represented by a number of values according to the number of spectral components so that a further analysis is required, namely, a comparison of the readings of each indicator with the permissible value and the calculation of the amplifier amplitude-frequency response distortion.

SUMMARY OF THE INVENTION

It is an object of the present invention to provide a testing device for low-frequency amplifiers that would ensure a wider coverage of the desired parameters by the tests.

Another object of the present invention is to provide a device that would ensure a reduction in the time of testing low-frequency amplifiers.

A further object of the present invention is to provide a device ensuring a simultaneous check of many parameters of low-frequency amplifiers.

With these and other objects in view, there is provided a testing device for low-frequency amplifiers, comprising a test signal generating means connected to the input of the amplifier to be tested; an indicating unit; and a set of circuits for measuring linear distortion, each including a filter connected to the output of the amplifier under test and tuned to one of the frequencies within its passband, a rectifier, and a comparison means, all connected in series. According to the invention, the test signal generating means comprises a number of sine-wave oscillators intended to produce voltages at frequencies corresponding to the tuning frequencies of said filters. Each of said circuits includes a squaring means having its input connected to the output of the comparison means. The testing device further comprises a second set of circuits for measuring non-linear distortion and interference, each including a filter connected to the output of the amplifier under test, a rectifier, and a squaring means with its output connected to the indicating unit, all connected in series. The filters of the circuits of the second set of circuits are tuned to frequency components of the amplifier output signal that differ from the frequencies of the oscillators. The outputs of the squaring means of the circuits of the first set and the outputs of the squaring means of those circuits of the second set, whose filters are tuned to the frequency components of the amplifier output signal that are used for evaluation of one and the same parameter, are connected to the respective inputs of the indicating unit through adders.

The use of several sine-wave voltages as the test signal in the proposed testing device discrimination at the output of the low-frequency amplifiers both of the test signal components and of the components not present in the test signal, thus providing a simultaneous measurement of linear and non-linear distortions. The adders inserted at the output of the circuits and used for measuring one and the same parameter make it possible to represent measurement results by a single number for each parameter without any additional calculations. Thus, the proposed testing device provides for a substantial reduction in the testing time without any impairment of the coverage of parameters by the tests.

Furthermore, the proposed testing device allows a more objective testing to be achieved since one may use a test signal much more closely approximating the signal typical for low-frequency amplifiers than the noise, e.g. a musical signal, and the objectiveness is known to depend on the type of the test signal.

It is advisable that the testing device would also comprise an additional adder having its inputs connected respectively with the outputs of the squaring means of all the circuits and its output connected to the respective input of the indicating unit.

In this case an integral single-valued estimation of all the low-frequency amplifier parameters is made, simultaneously providing a separate diagnostic test for each individual parameter. Any improvement of any amplifier parameter generally leads to a certain deterioration of its other parameters. When the integral estimate is available, one can unambiguously determine whether the overall performance of the amplifier unit is improved or impaired in every particular case.

Other and further objects and advantages of the invention will be better understood from the following description taken in conjunction with the accompanying drawing illustrating a preferred embodiment of the invention.

BRIEF DESCRIPTION OF THE DRAWING

The drawing is a block diagram of a testing device for low-frequency amplifiers in accordance with the present invention.

DETAILED DESCRIPTION OF THE PREFERRED INVENTION

Referring now to the accompanying drawing, the testing device for low-frequency amplifiers comprises a test signal generating means 1, two sets of low-frequency amplifier parameter measuring circuits 2 and 3 of which the circuit 2 is intended for measuring linear distortions and the circuit 3 is designed for measuring the non-linear distortions and interference, and an indicating unit 4 used for indicating the measurement results.

The test signal generating means 1 incorporates a plurality of sine-wave voltage oscillators 5 whose frequencies are within the passband of the low-frequency amplifiers, the frequencies of the oscillators 5 being selected in such a manner that they are not equal to the frequency components of the non-linear distortion products, the background noise, the noise and other interference signals. The outputs of the oscillators 5 are connected through an adder 6 to the input of the low-frequency amplifier 7 being tested.

Each of the circuits 2 comprises a filter 8, a rectifier 9, a comparison means 10, and a squaring means 11, all connected in series. The filters 8 are tuned to the frequency components of the test signal, that is to the frequencies of the oscillators 5. Each of the circuits 3 includes a filter 12, a rectifier 13, and a squaring means 14, all connected in series. The filters 12 are tuned to frequencies that are not present in the test signal, namely, to the frequencies of non-linear distortion products of the amplifier 7, as well as the frequencies of background noise, the noise and other interference signals. The inputs of the filters 8 and the filters 12 are connected to the output of the amplifier 7 the amplifier 7 being tested, which is also coupled with a loudspeaker 15 if coupled with a loudspeaker 15 if the latter is available.

The number of circuits 2 is equal to the number of frequency components of the test signal. The greater the number of the frequency components in the test signal, the more objective are the test results; however, an increase in the number of these frequency components leads, in turn, to more severe requirements for the filters il due to the limited frequency bands available for non-linear distortion analysis.

The number of circuits 3 is determined by the number of parameters being checked that are related with non-linear distortion and interference and by the number of frequency components required for the evaluation of each of said parameters. For example, the following requirements are possible:

three components for evaluation of the harmonic factor (the second, third and fourth harmonics of one of the test signal frequencies), two components for evaluation of the intermodulation factor at the frequencies $f_1+f_2$ and $2f_1+f_2$, where $f_1$ and $f_2$ are any frequencies of the test signal, one component for evaluation of the noise level, three components for evaluation of the background noise level at frequencies that are multiples of the power supply line frequency, for example, 50, 100 and 150 Hz, one component for the assessment of the channel isolation, when low-frequency amplifiers forming part of a stereophonic sound system are tested.

In this case the testing device would comprise ten circuits 3.

The indicating unit 4 is an ensemble of pointer, light or other similar measuring instruments 16, each used for indication of one of the parameters being checked. The number of inputs 17 of the indicating unit 4 is equal to the total number of the low-frequency amplifier parameters being checked. The inputs 17 of the indicating unit 4 are respectively connected to the outputs of the squaring means 11 and 14. If the parameter being checked is estimated using one component of the amplifier output signal (for example, the noise level), then the squaring means of the circuit whose filter is tuned to the frequency of this component is directly connected to the respective input of the indicating unit 4; whereas, if the parameter being checked is estimated from several components of the amplifier output signal (for example, the harmonic factor, the amplitude-frequency response distortion), then the squaring means of the circuits whose filters are tuned to the frequencies of these components are connected to the respective input of the indicating unit 4 through an adder 18. Thus, the number of adders 18 in the testing device is equal to the number of amplifier parameters being checked that are estimated using the values of several components of the amplifier output signal. The drawing illustrates the circuits 2 used for measuring the linear distortion of the amplifier, that are connected to the indicating unit 4 through one adder 18; however, two adders 18 may be used for the same circuits if it is necessary to indicate separately the low-frequency distortion and the high-frequency distortion.

As is known, the summation of squared frequency components is used for evaluation of the harmonic factor and other parameters related with the non-linear distortion. In the proposed testing device the squaring means are provided not only in the circuits 3 measuring non-linear distortion, but also in the circuits 2 used for measuring linear distortion. This fact makes it possible to compare and evaluate simultaneously all the distortion products including the linear distortion at the output of the amplifier 7 without any additional processing.

In accordance with one embodiment of the present invention the indicating unit 4 is provided with one more input 19 and one move measuring instrument 16 used to indicate whether the low-frequency amplifier 7 under test is acceptable as to all of the parameters being checked. In this case the testing device comprises an adder 20 whose output is connected with this input 19 of the indicating unit 4 and whose inputs are connected respectively with the outputs of the squaring means 11 and 14 in all of the circuits 2 and 3.

Measurements with the use of the proposed testing device may be accompanied by the aural monitoring of the sound reproduction quality of low-frequency amplifiers. In this case the frequencies of the oscillators 5 are selected so that they correspond to the consonance chord that makes the ear especially sensitive to various distortions including the distortions that are difficult to measure by means of equipment (the rattling, the central cut-off and so on). The consonance chord may be formed on the basis of the major sixth having a fundamental frequency ratio of 5:3. In this case the ratio of test signal frequency components be 1.5:2.5:3:5:6:10:12:20.

The proposed testing device operates in the following manner.

The test signal generating means 1 generates a signal built up of sine waves distributed through out the frequency range of the low-frequency amplifiers to be tested, for example, with the ratios corresponding to the consonance chord. The output signal of the amplifier 7 under test is applied to the circuits 2 and 3. In the circuits 2 the test signal components are separated by the filters 8, are rectified by the rectifiers 9 and are compared with reference voltages, $U_r$, supplied through potentiometers (not shown) from a direct current voltage source in the comparison means 10. The reference voltages, $U_r$, are set so that the output voltages of the comparison members 10 are zero if low-frequency amplifiers with the desired frequency response characteristic are tested. If the frequency response of the low-frequency amplifier differs from the desired one, voltages proportional to the deviations of components at certain frequencies from the desired values appear at the outputs of the comparison means 10. These voltages are squared by the squaring means 11 and added by the adders 18 (or by two adders 18 if the low-frequency linear distortion and the high-frequency linear distortion are checked separately). The larger is the difference of the amplifier frequency response characteristic from the desired one, the higher will be the output voltage of the adder 18 connected to the circuits 2.

At the same time the output signal of the amplifier under test 7 is applied to the inputs of the circuits 3. Each of the components of non-linear distortion products, noise and background noise is fed to one of the circuits 3 having the filter 12 tuned to the frequency that corresponds to the frequency of this component. On passing the filters 12, the signals are rectified by the rectifiers 13, are converted in the squaring means 14 and are added for individual parameters in the adders 18 if several components are required to characterize the parameter.

The signals characterizing individual parameters of the amplifiers are applied to the respective inputs 17 of the indicating unit 4. Thus, the information on all of the parameters being checked is displayed simultaneously by the instruments 16 of the indicating unit 4 right after the application of the test signal to the amplifier 7.

If the proposed testing device is provided with the adder 20 combining the outputs of all of the circuits 2 and 3, the integral estimate of the amplifier 7 under test is displayed also by the instrument of the indicating unit 4, that is connected to the input 19.

Thus, the proposed testing device provides for the reduction in the testing time of low-frequency amplifiers and the increase in the amount of information produced in the testing, thus increasing the probability of production of defect-free items and, hence, reducing the expenditures for repairing the items in service.

While particular embodiments of the invention have been shown and described, various modifications thereof will be apparent to those skilled in the art and therefore it is not intended that the invention be limited to the disclosed embodiments or to the details thereof and departures may be made therefrom within the spirit and scope of the invention as defined in the appended claims.

What is claimed is:

1. A testing device for low-frequency amplifiers, comprising:

sine-wave voltage oscillators having outputs intended for connection to the input of a low-frequency amplifier under test in order to generate a test signal including a plurality of components;

a first set of circuits intended for measuring linear distortion, said circuits of said first set comprising each a filter connected to an output of said low-frequency amplifier under test and tuned to the frequency of one of said components of said test signal, a rectifier, a comparison means designed for generating a signal proportional to the value of deviation of said component at this frequency from the desired value and a squaring means having an output, all of them connected in series;

a second set of circuits intended for measuring non-linear distortion and interference, said circuits of said second set comprising each a filter connected to the output of said low-frequency amplifier under test, a rectifier and a squaring means having an output, all of them connected in series;

said filters of said circuits of said second set being tuned to frequencies differing from said frequency components of said test signal;

an indicating unit having a plurality of inputs whose number is equal to the total number of parameters of said low-frequency amplifiers, that are to be checked, said inputs of said indicating unit being respectively connected to said outputs of said squaring means of said respective circuits of said first and second sets of circuits; and adders whose number is equal to the number of parameters of said low-frequency amplifier, evaluated with the use of a member of components of its output signal, the outputs of said squaring means that are included into those of said circuits whose filters are tuned to the frequency components of the low-frequency amplifier output signal, characterizing one and the same parameter being connected to the respective inputs of said plurality of the inputs of said indicating unit through said adders.

2. A testing device for low-frequency amplifiers as defined in claim 1, wherein said indicating unit is provided with an additional input intended for application of a signal used to indicate whether said low-frequency amplifier under test is acceptable as to all of the parameters being checked and which further comprises one more adder having a plurality of inputs whose number is equal to the number of said circuits of both of said sets and which are connected respectively to said outputs of said squaring means of the circuits forming both of said sets, and an output connected to said additional input of said indicating unit.

* * * * *